(12) United States Patent
Midtgaard

(10) Patent No.: US 7,049,887 B2
(45) Date of Patent: May 23, 2006

(54) ENVELOPE ELIMINATION AND RESTORATION LINEAR AMPLIFIER

(75) Inventor: Jacob Midtgaard, Fredensborg (DK)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/663,227

(22) Filed: Sep. 16, 2003

(65) Prior Publication Data

US 2004/0108896 A1 Jun. 10, 2004

(30) Foreign Application Priority Data

Sep. 17, 2002 (GB) .................................. 0221593.7

(51) Int. Cl.
*H03G 3/20* (2006.01)
(52) U.S. Cl. ....................................... 330/136; 330/129
(58) Field of Classification Search ................ 330/136, 330/129, 279, 86, 85, 10, 149, 107; 332/455; 375/297

See application file for complete search history.

(56) References Cited

U.S. PATENT DOCUMENTS

| 4,024,575 | A | * | 5/1977 | Harney et al. ............... 380/206 |
| 5,847,602 | A | * | 12/1998 | Su ............................... 330/10 |
| 5,886,572 | A | * | 3/1999 | Myers et al. .................. 330/10 |
| 6,445,249 | B1 | * | 9/2002 | Khan et al. .................. 330/149 |
| 6,600,369 | B1 | * | 7/2003 | Mitzlaff ...................... 330/149 |

OTHER PUBLICATIONS

European Telecommunication Standard, ETS 300 392-2, Mar., 1996, pp. 1-583 Radio Equipment and Systems (RES); Trans-European Trunked Radio (TETRA); Voice plus Data (V+D); Part 2: Air Interface (AI).

European Telecommunication Standard, ETS 300 396-2, Mar., 1998, pp. 1-48 Terrestrial Trunked Radio (TETRA); Technical requirements for Direct Mode Operation (DMO); Part 2: Radio Aspects.

2000 The Institution of Electrical Engineers; Increasing Talk-Time with Efficient Linear PA's pp. 6/1-6/22.

\* cited by examiner

*Primary Examiner*—Henry Choe
(74) *Attorney, Agent, or Firm*—Perman & Green, LLP

(57) ABSTRACT

The gain of an envelope elimination and restoration linear amplifier is controlled by controlling the gain of its envelope control feedback path.

51 Claims, 2 Drawing Sheets

ENVELOPE ELIMINATION AND RESTORATION LINEAR AMPLIFIER

BACKGROUND OF THE INVENTION

1. Field of the Invention

The present invention relates to an envelope elimination and restoration linear amplifier.

2. Brief Description of Related Developments

The present trend in portable communications devices such as mobile telephones is to increasingly lightweight devices with increased talk-time between battery recharge cycles. Such developments require ever more efficient radio-frequency (RF) amplifiers to minimise power consumption. In cellular systems such as GSM, the modulation scheme is a constant amplitude scheme, also referred to as constant envelope modulation, which permits use of efficient non-linear amplifiers. However, recent types of communication system such as EDGE and UMTS use non-constant envelope modulation schemes. The drawback is that the amplification of non-constant envelope RF signals requires the use of linear power amplifiers, which are inherently less efficient. The lower power efficiency of linear amplifiers translates into higher power consumption and higher heat dissipation.

A variety of linearisation architectures and schemes exist, including fixed and adaptive pre-distortion, adaptive bias, envelope elimination and restoration, polar loop and Cartesian loop transmitters. Details of such devices are shown in "Increasing Talk-Time with Efficient Linear PA's", IEE Seminar on TETRA Market and Technology Developments, Mann S, Beach M, Warr P and McGeehan J, Institution of Electrical Engineers, 2000, which is incorporated herein by reference. However, many of these devices and techniques are unsuitable for battery operated portable devices such as mobile telephones, or are incapable of meeting current RF design standards, such as the TETRA linearity standard, ETSI publication ETS 300 396-2; "Trans-European Trunked Radio (TETRA);—Voice plus Data (V+D)—Part 2: Air Interface (AI)"; March 1996.

Envelope elimination and restoration (EER) transmitters separate envelope and phase information from an input modulated signal. The phase information is then passed through a power amplifier as a constant envelope signal, permitting the use of efficient, non-linear amplifiers, while the envelope signal is added to the power amplifier output. In order to correct AM-PM distortion, phase feedback is employed and the power amplifier is effectively placed within a phase-locked loop.

The envelope of the output signal is controlled by another feedback loop. Predistortion has been used to improve stability of the loops. However, the predistortion required is dependent on power level and does not correct for errors in the feedback path.

SUMMARY OF THE INVENTION

According to the present invention, there is provided an envelope elimination and restoration linear amplifier comprising an envelope control loop including a feedback path, wherein the gain of said feedback path is variable for controlling the gain of the amplifier.

Consequently, the predistortion required is independent of the output power level. Also, where the amplifier is used as the RF power amplifier of a transmitter, there are improvements with respect to adjacent channel power and EVM/phase error.

The gain of the feedback path may be controlled by means of a variable gain amplifier and/or a variable attenuator. Such circuits are well-known in the art.

Preferably, the amplifier includes a phase control loop. More preferably, the feedback path is shared by the envelope control and phase control loops.

Preferably, the feedback path includes downconverter means for downconverting the frequency of the feedback signal therein. More preferably, the feedback path includes gain control means before the downconverter means.

Preferably, the gain of the feedback path is electronically controllable. More preferably, the feedback path comprises variable gain means responsive to a control signal to set its gain.

The present invention is particularly applicable to the RF power amplifiers of communications devices, e.g. mobiles phones. Preferably, such devices include control means for determining a desired output power and providing a corresponding control signal to the amplifier.

DETAILED DESCRIPTION OF THE PREFERRED EMBODIMENT

An embodiment of the present invention will now be described, by way of example, with reference to the accompanying drawings.

Figure 1:
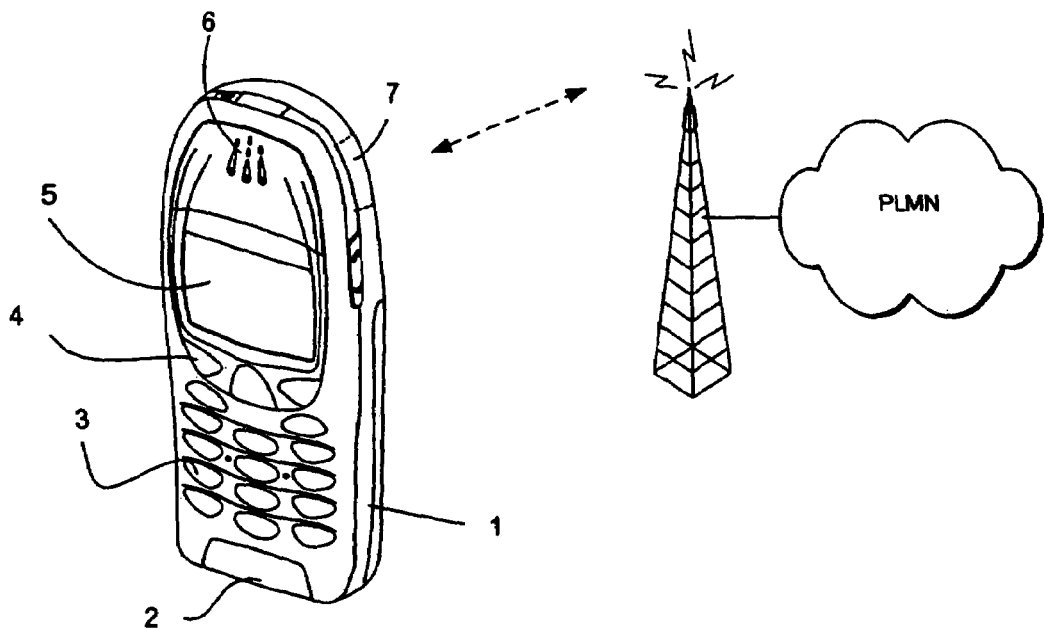
FIG. 1 is a perspective view of a mobile telephone handset.

Referring to FIG. 1, a mobile station in the form of a mobile telephone handset 1 includes a microphone 2, keypad 3, with soft keys 4 which can be programmed to perform different functions, an LCD display 5, a speaker 6 and an antenna 7 which is contained within the housing.

The mobile station 1 is operable to communicate through cellular radio links with individual public land mobile networks (PLMNs) operating according to communication schemes such as UMTS and EDGE.

Figure 2:
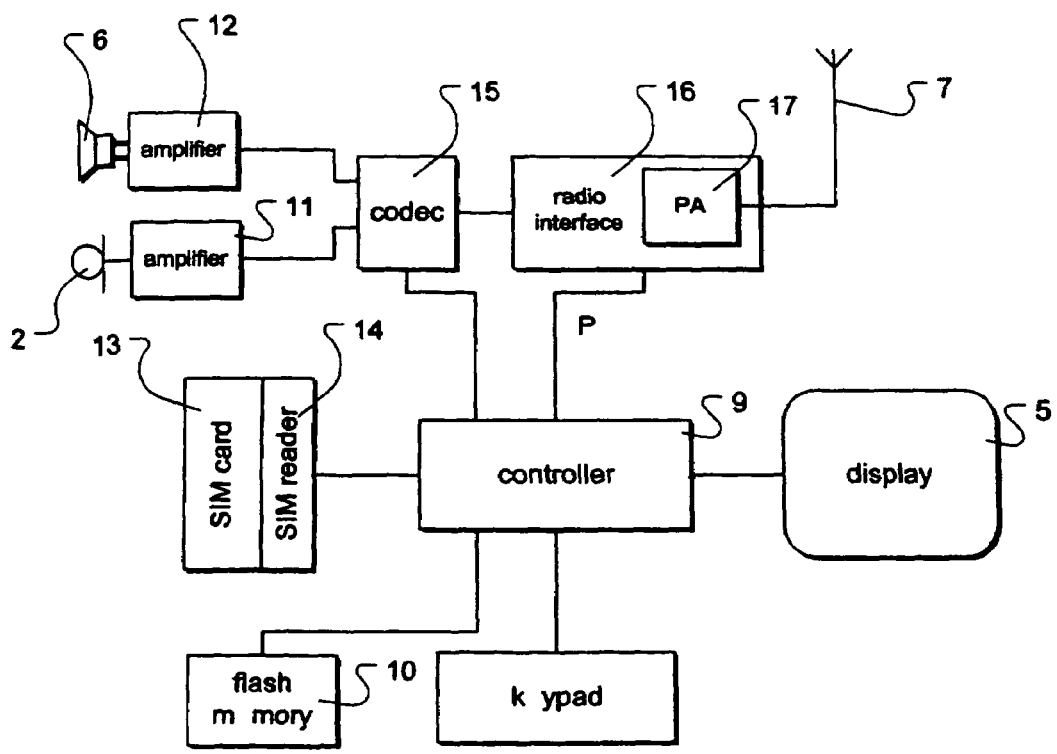
FIG. 2 is a schematic diagram of mobile telephone circuitry for use in the telephone handset of FIG. 1.

FIG. 2 illustrates the major circuit components of the telephone handset 1. Signal processing is carried out under the control of a digital micro-controller 9 which has an associated flash memory 10. Electrical analogue audio signals are produced by microphone 2 and amplified by pre-amplifier 11. Similarly, analogue audio signals are fed to the speaker 6 through an amplifier 12. The micro-controller 9 receives instruction signals from the keypad and soft keys 3, 4 and controls operation of the LCD display 5.

Information concerning the identity of the user is held on a smart card 13 in the form of a GSM SIM card which contains the usual GSM international mobile subscriber identity (IMSI) and an encryption key $K_i$ that is used for encoding the radio transmission in a manner well known per se. The SIM card is removably received in a SIM card reader 14.

The mobile telephone circuitry includes a codec 15 and an rf stage 16 including a power amplifier stage 17 feeding the antenna 7. The codec 15 receives analogue signals from the microphone amplifier 11, digitises them into an appropriate signal format and feeds them to the power amplifier stage 17 in the rf stage 16 for transmission through the antenna 7 to the PLMN shown in FIG. 1. Similarly, signals received from the PLMN are fed through the antenna 7 to be demodulated in the rf stage 16 and fed to codec 15, so as to produce analogue signals fed to the amplifier 12 and speaker 6.

Figure 3:
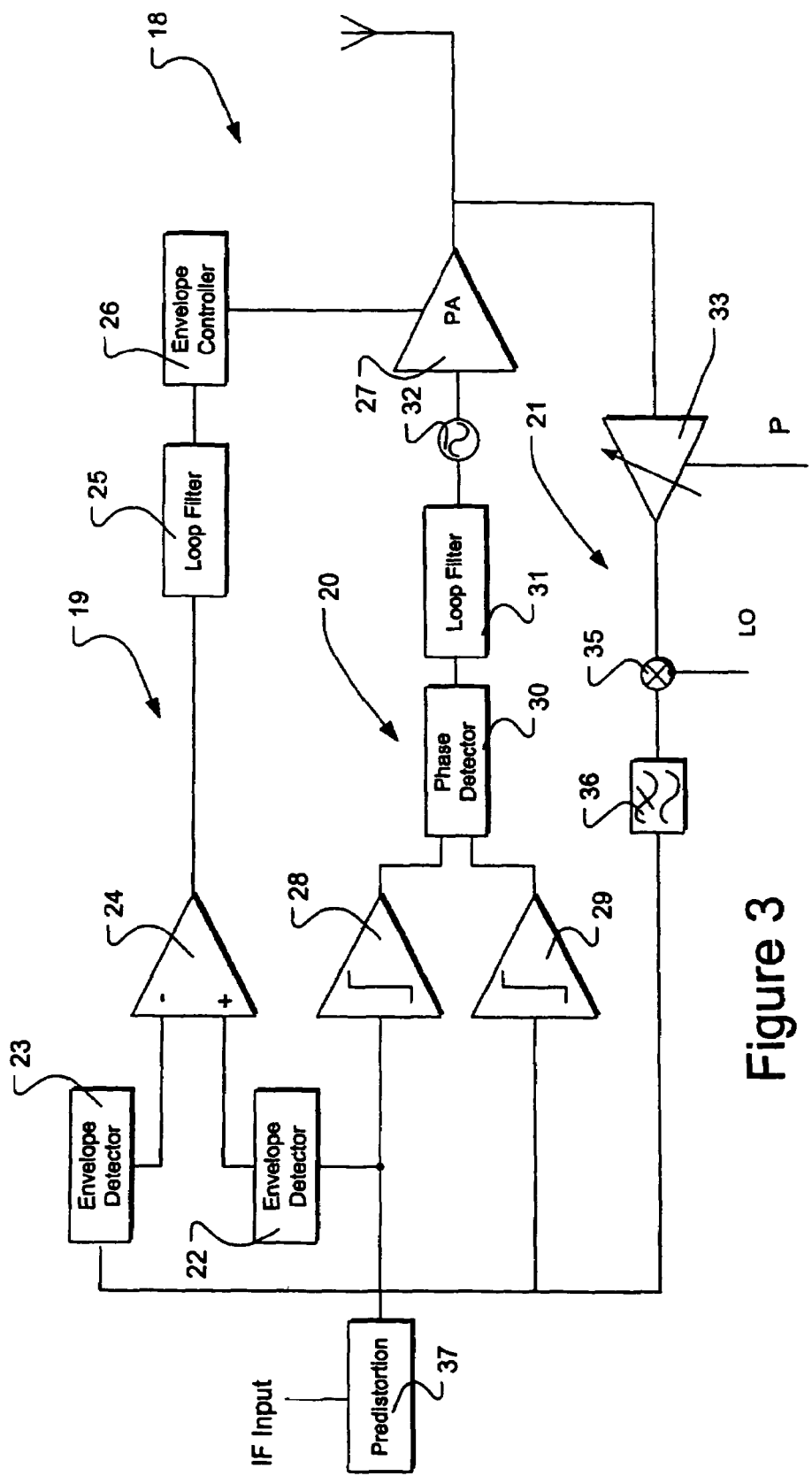
FIG. 3 is a block diagram of an embodiment of the present invention.

Referring to FIG. 3, the power amplifier stage 17 comprises an envelope elimination and restoration (EER) amplifier 18 which separates the envelope and phase components of an input modulated IF signal into two separate forward paths 19, 20. A common feedback path 21 is used for control of both the envelope and phase components of the RF output by the amplifier stage 17.

The envelope forward path 19 comprises first and second envelope detectors 22, 23 which detect the envelopes of the input modulated IF signal and the feedback signal from the feedback path 21 respectively. The outputs of the envelope detectors 22, 23 are fed to respective inputs of a comparator 24. The output of the comparator 24 is filtered by a low-pass filter 25 and applied to an envelope controller 26.

The envelope controller 26 comprises a fast power supply modulator which directly modulates the supply voltage of the actual power amplifying part 27.

The phase forward path 20 comprises first and second limiters 28, 29 which limit the input modulated IF signal and the feedback signal respectively to produce respective constant-amplitude signals. The constant amplitude signals are applied to a phase detector 30 and the output of the phase detector 30 is filtered by a low-pass filter 31 and applied to a voltage-controlled oscillator 32 as is conventional in a phase-lock loop. The RF signal produced by the voltage-controlled oscillator 32 is input into the power amplifying part 27 which amplifies it in dependence on the signal input to the envelope controller 26.

The output of the power amplifying part 27 is fed to an antenna and a variable gain amplifier 33. The output of the variable gain amplifier 33 is connected to one input of a mixer 35. The other input of the mixer 35 receives a local oscillator signal. The output of the mixer is low-pass filtered by a feedback path filter 36 to select a low frequency mixing product. Thus, the mixer 35 and filter 36 act to down convert the RF output of the amplifying part 27 to the IF signal frequency.

The output of the feedback path filter 36 is fed to the inputs of the second envelope detector 23 and the second limited 29 to complete the feedback paths of the envelope and phase control loops.

In operation, the IF input is provided at a constant level, irrespective of the output power level required, and with a constant predistortion applied by a predistortion circuit 37. The predistortion required will depend on the particular circuitry employed and the technique is well-known in the art. The output power of the power amplifying part 27 is controlled by controlling the gain of the variable gain amplifier 33. The gain of the variable gain amplifier 33 is set by a power control signal (P) from the mobile phone's controller 9 (FIG. 2).

It will be appreciated that if the gain of variable gain amplifier 33 is reduced, the output power of the power amplifying part 27 will increase and vice versa.

It will be appreciated that many alterations to the above-described embodiment may be made.

The invention claimed is:

1. An envelope elimination and restoration linear amplifier comprising
    an envelope detector configured to detect an envelope component from an input modulated signal for output along a first forward path;
    a separator configured to separate an input modulated signal into an envelope component and a phase component for output along respective first and second forward paths, the second forward path being separate from said first forward path;
    an amplifying part arranged to generate an output signal based on said envelope component and said phase component; and
    an envelope control loop including a feedback path, wherein the gain of said feedback path is variable for controlling the gain of the amplifier.

2. An amplifier according to claim 1, wherein said feedback path includes a downconverter for downconverting the frequency of the feedback signal therein.

3. An amplifier according to claim 2, wherein said feedback path includes a gain controller before the downconverter.

4. An amplifier according to claim 1, including a phase control loop.

5. An amplifier according to claim 4, wherein said feedback path includes a downconverter for downconverting the frequency of the feedback signal therein.

6. An amplifier according to claim 5, wherein said feedback path includes gain control means before the downconverter.

7. An amplifier according to claim 1, wherein said feedback path is shared by the envelope control and phase control loops.

8. An amplifier according to claim 7, wherein said feedback path includes a downconverter for downconverting the frequency of the feedback signal therein.

9. An amplifier according to claim 8, wherein said feedback path includes a gain controller before the downconverter.

10. An amplifier according to claim 1, wherein the gain of the feedback path is electronically controllable.

11. An amplifier according to claim 10, wherein the feedback path comprises variable gain means responsive to a control signal to set its gain.

12. A Communications device including a RF power amplifier according to claim 10.

13. A communications device including a RF power amplifier according to claim 11.

14. A communications device according to claim 12, including a controller for determining a desired output power and providing a corresponding control signal to the amplifier.

15. A communications device according to claim 13, including a controller for determining a desired output power and providing a corresponding control signal to the amplifier.

16. A communications device according to claim 12, including a predistortion circuit for predistorting an input signal to compensate for signal distortion in the amplifier, the output of the predistortion circuit forming the input for the amplifier, wherein the predistortion applied by the predistortion circuit is independent of the gain of the amplifier.

17. A communications device according to claim 13, including a predistortion circuit for predistorting an input signal to compensate for signal distortion in the amplifier, the output of the predistortion circuit forming the input for the amplifier, wherein the predistortion applied by the predistortion circuit is independent of the gain of the amplifier.

18. An envelope elimination and restoration linear amplifier comprising:
    an envelope detector configured to detect an envelope component from an input modulated signal for output along a first forward path;

a separator configured to separate an input modulated signal into an envelope component and a phase component for output along respective first and second forward paths, the second forward path being separate from said first forward path;

an amplifying part arranged to generate an output signal based on said envelope component and said phase component; and an envelope control loop including a feedback path, wherein the gain of said feedback path is variable for controlling the gain of the amplifier and said feedback path includes a downconverter for downconverting the frequency of the feedback signal therein.

19. An amplifier according to claim 18, wherein said feedback path includes a gain controller before the downconverter.

20. An amplifier according to claim 18, including a phase control loop.

21. An amplifier according to claim 20, wherein said feedback path includes a gain controller before the downconverter.

22. An amplifier according to claim 18, wherein said feedback path is shared by the envelope control and phase control loops.

23. An amplifier according to claim 22, wherein said feedback path includes a gain controller before the downconverter.

24. An amplifier according to claim 18, wherein the gain of the feedback path is electronically controllable.

25. An amplifier according to claim 24, wherein the feedback path comprises variable gain means responsive to a control signal to set its gain.

26. A communications device including a RF power amplifier according to claim 24.

27. A communications device including a RF power amplifier according to claim 25.

28. A communications device according to claim 26, including a controller for determining a desired output power and providing a corresponding control signal to the amplifier.

29. A communications device according to claim 27, including a controller for determining a desired output power and providing a corresponding control signal to the amplifier.

30. A communications devices according to claim 26, including a predistortion circuit for predistorting an input signal to compensate for signal distortion in the amplifier, the output of the predistortion circuit forming the input for the amplifier, wherein the predistortion applied by the predistortion circuit is independent of the gain of the amplifier.

31. A communications devices according to claim 27, including a predistortion circuit for predistorting an input signal to compensate for signal distortion in the amplifier, the output of the predistortion circuit forming the input for the amplifier, wherein the predistortion applied by the predistortion circuit is independent of the gain of the amplifier.

32. An envelope elimination and restoration linear amplifier comprising:

an envelope detector configured to detect an envelope component from an input modulated signal for output along a first forward path;

a separator configured to separate an input modulated signal into an envelope component and a phase component for output along respective first and second forward paths, the second forward path being separate from said first forward path;

an amplifying part arranged to generate an output signal based on said envelope component and said phase component; and an envelope control loop including a feedback path, wherein the gain of said feedback path is variable for controlling the gain of the amplifier, said feedback path includes a downconverter for downconverting the frequency of the feedback signal therein and said feedback path includes a gain controller before the downconverter.

33. An amplifier according to claim 32, including a phase control loop.

34. An amplifier according to claim 33, wherein said feedback path is shared by the envelope control and phase control loops.

35. An amplifier according to claim 32, wherein the gain of the feedback path is electronically controllable.

36. An amplifier according to claim 35, wherein the feedback path comprises variable gain means responsive to a control signal to set its gain.

37. A communications device including a RF power amplifier according to claim 35.

38. A communications device including a RF power amplifier according to claim 36.

39. A communications device according to claim 37, including a controller for determining a desired output power and providing a corresponding control signal to the amplifier.

40. A communications device according to claim 33, including a controller for determining a desired output power and providing a corresponding control signal to the amplifier.

41. A communications device according to claim 37, including a predistortion circuit for predistorting an input signal to compensate for signal distortion in the amplifier, the output of the predistortion circuit forming the input for the amplifier, wherein the predistortion applied by the predistortion circuit is independent of the gain of the amplifier.

42. A communications devices according to claim 38, including a predistortion circuit for predistorting an input signal to compensate for signal distortion in the amplifier, the output of the predistortion circuit forming the input for the amplifier, wherein the predistortion applied by the predistortion circuit is independent of the gain of the amplifier.

43. An envelope elimination and restoration linear amplifier comprising:

an envelope detector configured to detect an envelope component from an input modulated signal for output along a first forward path;

a separator configured to separate an input modulated signal into an envelope component and a phase component for output along respective first and second forward paths, the second forward path being separate from said first forward path;

an amplifying part arranged to generate an output signal based on said envelope component and said phase component; and an envelope control loop including a feedback path and a phase control loop, wherein the gain of said feedback path is variable for controlling the gain of the amplifier, said feedback path includes a downconverter for downconverting the frequency of the feedback signal therein, said feedback path includes a gain controller before the downconverter, and said feedback path is shared by the envelope control and phase control loops.

44. An amplifier according to claim 43, wherein the gain of the feedback path is electronically controllable.

45. An amplifier according to claim 44, wherein the feedback, path comprises variable gain means, responsive to a control signal to set its gain.

46. A communications device including a RF power amplifier according to claim 44.

47. A communications device including a RF power amplifier according to claim 45.

48. A communications device according to claim 44, including a controller for determining a desired output power and providing a corresponding control signal to the amplifier.

49. A communications device according to claim 45, including a controller for determining a desired output power and providing a corresponding control signal to the amplifier.

50. A communications devices according to claim 46, including a predistortion circuit for predistorting an input signal to compensate for signal distortion in the amplifier, the output of the predistortion circuit forming the input for the amplifier, wherein the predistortion applied by the predistortion circuit is independent of the gain of the amplifier.

51. A communications device according to claim 47, including a predistortion circuit for predistorting an input signal to compensate for signal distortion in the amplifier, the output of the predistortion circuit forming the input for the amplifier, wherein the predistortion applied by the predistortion circuit is independent of the gain of the amplifier.

* * * * *